(12) United States Patent
Dooper

(10) Patent No.: US 8,681,853 B2
(45) Date of Patent: Mar. 25, 2014

(54) PULSE DENSITY MODULATION METHOD AND APPARATUS

(75) Inventor: Lûtsen Ludgerus Albertus Hendrikus Dooper, Brummen (NL)

(73) Assignee: NXP B.V., Eindhoven (NL)

( * ) Notice: Subject to any disclaimer, the term of this patent is extended or adjusted under 35 U.S.C. 154(b) by 521 days.

(21) Appl. No.: 13/044,300

(22) Filed: Mar. 9, 2011

(65) Prior Publication Data
US 2011/0221540 A1 Sep. 15, 2011

(30) Foreign Application Priority Data
Mar. 10, 2010 (EP) .................................... 10156140

(51) Int. Cl.
*H03K 7/08* (2006.01)
*H04L 25/08* (2006.01)
*H04B 15/00* (2006.01)

(52) U.S. Cl.
USPC ........... 375/238; 375/217; 375/346; 381/94.5

(58) Field of Classification Search
CPC .......... H03F 2200/345; H03F 220/351; H03F 2200/372; H03K 7/08; H03G 3/348
USPC ......... 375/238, 216, 217, 256, 257, 316, 346, 375/377; 370/203, 205; 381/56, 57
See application file for complete search history.

(56) References Cited

U.S. PATENT DOCUMENTS

| | | | |
|---|---|---|---|
| 4,142,066 A | 2/1979 | Ahamed | |
| 7,612,608 B2 * | 11/2009 | Kozak et al. | 330/251 |
| 8,022,756 B2 * | 9/2011 | Walker et al. | 330/10 |
| 8,223,991 B2 * | 7/2012 | Forte | 381/94.5 |
| 2002/0025010 A1 | 2/2002 | Yamazaki | |
| 2006/0013413 A1 * | 1/2006 | Sakaidani | 381/104 |
| 2008/0042746 A1 * | 2/2008 | Kozak et al. | 330/251 |
| 2008/0049952 A1 * | 2/2008 | Jung et al. | 381/94.5 |

* cited by examiner

*Primary Examiner* — Tesfaldet Bocure

(57) ABSTRACT

A pulse density modulation, PDM, driver, outputs a PDM stream and can be switched to a control token. The switch takes place when the first integral of the PDM stream has a magnitude less than or equal to a first predetermined value and the second integral of the PDM stream has a magnitude less than or equal to a second predetermined value.

11 Claims, 4 Drawing Sheets

PULSE DENSITY MODULATION METHOD AND APPARATUS

CROSS-REFERENCE TO RELATED APPLICATIONS

This application claims the priority under 35 U.S.C. §119 of European patent application no. 10156140.5, filed on Mar. 10, 2010, the contents of which are incorporated by reference herein.

The invention relates to apparatus using pulse density modulation and methods of operation. Audio amplifiers with a digital input interface are now available. Such audio amplifiers with a digital input instead of an analog input can be more robust against disturbances.

BACKGROUND

One advantage of using a digital input for an audio amplifier is that the layout of the printed circuit board (PCB) between the inputs and the amplifier is less critical than when using analog inputs. A second advantage is that the digital to analog conversion is implemented at the amplifier side, rather than at an earlier stage, for example in an audio processor. This reduces the total system costs, because the processors for processing audio data are typically made using advanced CMOS technology (CMOS90 or smaller), in which technology the area required for analog signals is large compared to the same required area needed at the amplifier side.

A one-bit pulse density modulation (PDM) stream may originate from a one-bit sigma-delta converter, in an audio processor, which can be relatively inexpensive. A good example of a PDM stream is the direct stream digital (DSD) stream used in super audio applications (SACD). This stream is a 64 times over-sampled one-bit PDM stream.

The advantage of using such a stream is that interpolation and sigma delta modulation, which is required for Digital to Analog conversion, is done at the audio processor side. Such interpolation requires a large chip area if it is done in the amplifier.

SUMMARY

According to an aspect of the invention there is provided a method according to claim 1.

By injecting the repetitive pattern at the right moment in time, when the first and/or second integrals are both low, audible pops and clicks in the output are minimised.

Preferably, both the first and second integrals are low to provide further reduced audibility.

In another aspect, the invention relates to an apparatus according to claim 7.

BRIEF DESCRIPTION OF THE DRAWINGS

For a better understanding of the invention embodiments will now be described, purely by way of example, with reference to the accompanying drawings in which.

DETAILED DESCRITION

Figure 1:
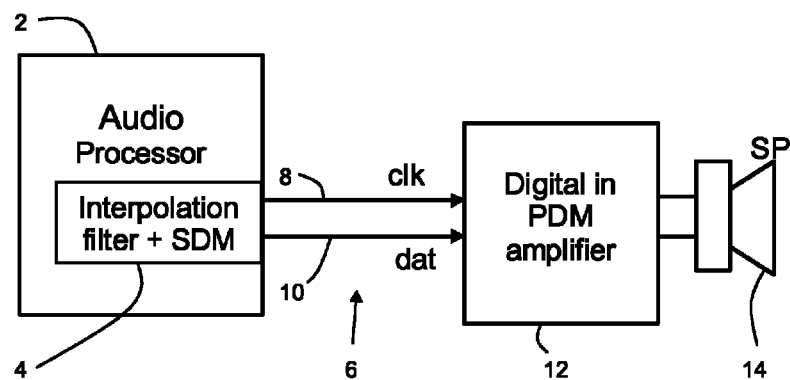
FIG. 1 shows a audio processor connected to an amplifier by a digital interface.

FIG. 1 shows the setup of an audio processor 2 incorporating an interpolation filter and a sigma-delta module 4 providing data along a PDM interface bus 6 consisting of only two wires, a clock wire 8 and a data wire 10. The digitial data is used to drive amplifier 12 which in turn drives a loudspeaker 14.

The audio processor 2 needs to be able to send control signals, and these are sent over the same two wires of the bus 6. This cancels the need for extra control bus lines. A special pattern of bits is injected in the PDM stream as a control signal to instruct a corresponding function at the amplifier side. An example of a control pattern is a repetitive 11001100 (0×CC) pattern which is used to set the amplifier in mute. The audio content of this pattern is zero at low frequencies (<20 kHz). There are a number of different patterns which are possible with zero audio content. Different repetitive patterns can be recognized by the amplifier 12—these different patterns are used to signal different control signals. The control signal may also be referred to as a control stream.

One of the key specifications of audio playback is the prevention of an audible pop or click when settings are changed. A problem occurs at the transition between the PDM audio signal and the repetitive pattern. If no special action is taken, a click or pop can be audible at the amplifier side during this transition. Such a click or pop may be referred to as "pop noise".

One possible simple solution would be to store some samples at the amplifier side, which is equal to the length of the control pattern. However, the repetitive pattern needs to be sufficiently long to prevent false triggering because the PDM stream sometimes generates the same pattern as the tokens. The length of the repetitive patterns should therefore be long enough to reduce the chance of false triggering. A suitable length of time is about 666 μs, which corresponds to 512 repetitions of the 0×66 pattern if the clock input equals 6.144 MHz. However, storing the samples in the amplifier before sending them to drive the speaker is not really a good solution, since this introduces latency which is too long for some other applications, such as noise cancellation. Storing all the samples requires also extra silicon area.

Accordingly, the method instead selects the right moment in time to inject the repetitive pattern at the right moment in time, the right moment being when the PDM has no audio content.

One way this might be implemented would be by using by a soft mute sequence at the audio processor before the repetitive pattern is injected. However, such an approach would not be enough to prevent pops and clicks. Although the average of the PDM stream is zero, still the right moment has to be chosen to inject the pattern.

Instead of these approaches, the inventor has realised that a good time to introduce a repetitive control sequence, also known as a token, is when the integral and or the second integral of the PDM stream are zero.

Figure 2:
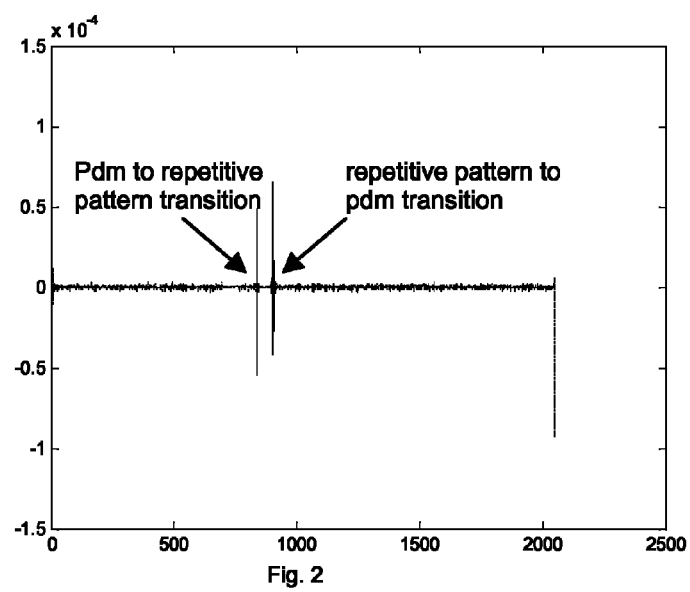
FIG. 2 shows the audible signal caused by injecting a repetitive pattern at a time according to an embodiment of the invention.
Figure 3:
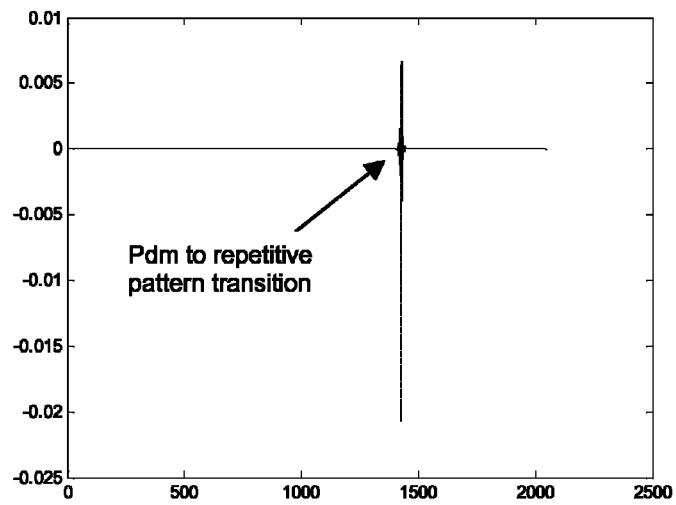
FIG. 3 shows the audible signal caused by injecting a repetitive pattern at a time according to a comparative example.

FIG. 2 shows the spike in the output analog audio signal (in V) caused by injecting a repetitive pattern using a method according to the invention. The audio signal has a spike of about 1 mV in this example. This may be compared to the comparative example of FIG. 3 where a repetitive pattern is injected without waiting for a suitable time—in this case the introduction generates a spike about twenty times higher, i.e. about 20 mV.

Figure 4:
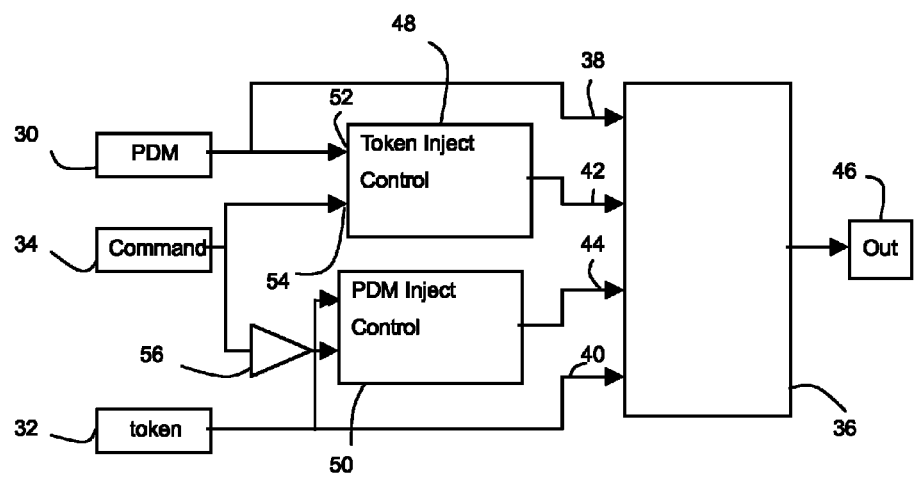
FIG. 4 shows a block diagram of an embodiment of the invention.

FIG. 4 shows a block diagram of the circuit in the audio processor 2 used to inject a token. The circuit has three inputs, a circuit PDM input 30 accepting a PDM stream, a circuit token input 32 accepting a stream of tokens, and a circuit command input 34 accepting a signal selecting between the PDM and the token streams.

Switch 36 is used to switch between the streams, and it has a switch PDM input 38 connected to the circuit PDM input 30, a switch token input 40 connected to the circuit token input 32, and two control inputs, namely an inject token control input 42 and an inject PDM control input 44. A signal on a control input 42,44 causes the switch to provide the respective signal on output 46. Thus, as soon as a signal is provided on the inject token control input 42, the switch outputs the signal on switch token input 40 to output 46. Similarly, as soon as a signal is provided on the inject PDM control input 44, the switch 36 outputs the signal on switch PDM input 38 to output 46.

Command logic (48,50,56) is used to control the switch 36. The timing of the switch between the PDM and token streams is moderated by the command logic which includes two additional control units, a token inject control unit 48 with its output connected to the inject token control input 42 of the switch 36, and a PDM inject control unit 50 with its output connected to the inject PDM control input 44. Each of the additional control units has a stream input 52 connected to the circuit PDM control input 30 or the circuit token control input 32 and a command input 54 connected to the circuit command input 34. The command input 54 of the PDM control unit 50 is connected to the circuit command input 34 via an inverter 56, whereas the command input 54 of the token inject control unit 48 is connected directly to the circuit command input 34.

In alternative embodiments, the inverter 56 may be omitted and replaced with modified logic inside one or both of the additional control units.

Figure 5:
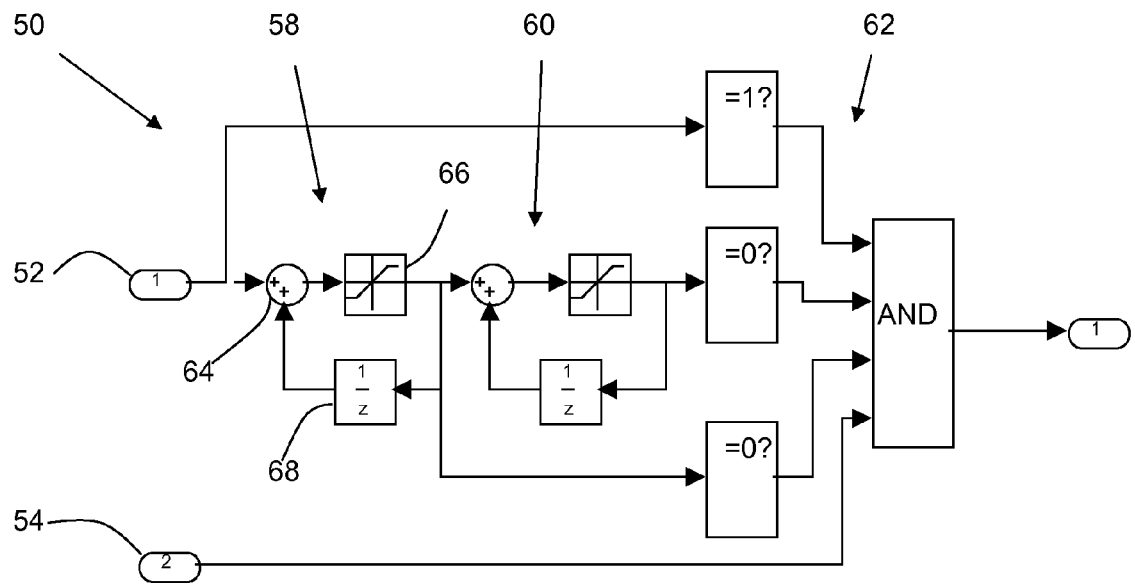
FIGS. 5 and 6 show details of two of the components of the embodiment of FIG. 4.

FIG. 5 illustrates the PDM inject control unit 50. A first integrator 58 with input connected to the stream input 52 and a second integrator 60 connected to the first integrator 58. Thus, the first integrator 58 calculates the first integral of the PDF stream and the second integrator 60 calculates the second integral.

In the embodiment both integrators 58, 60 are made up of an adder 64, a limiter 66 and a delay 68. Limiter 66 rejects the initial value of the first and second integral. If this initial is not rejected the integrals can have an offset, which can give a false triggering.

In the embodiment described, the limiter limits the value to +1, 0 or −1.

Logic 62 is provided to check when both integrals are zero and the PDM is 1 at the same time as an appropriate input on command input 54. At this point, the token inject control unit 48 outputs a signal to the token control input 42 of switch 36 which causes the token signal from circuit token input 32 to be to be injected and provided on output 46. The logic includes a one-detector for detecting a one in the PDM stream, and two zero detectors for detecting a zero output, one zero detector being provided for each integrator. The outputs of the one-detector and the two zero-detectors are put through a multiple input AND gate to output the signal on output 46.

Figure 6:
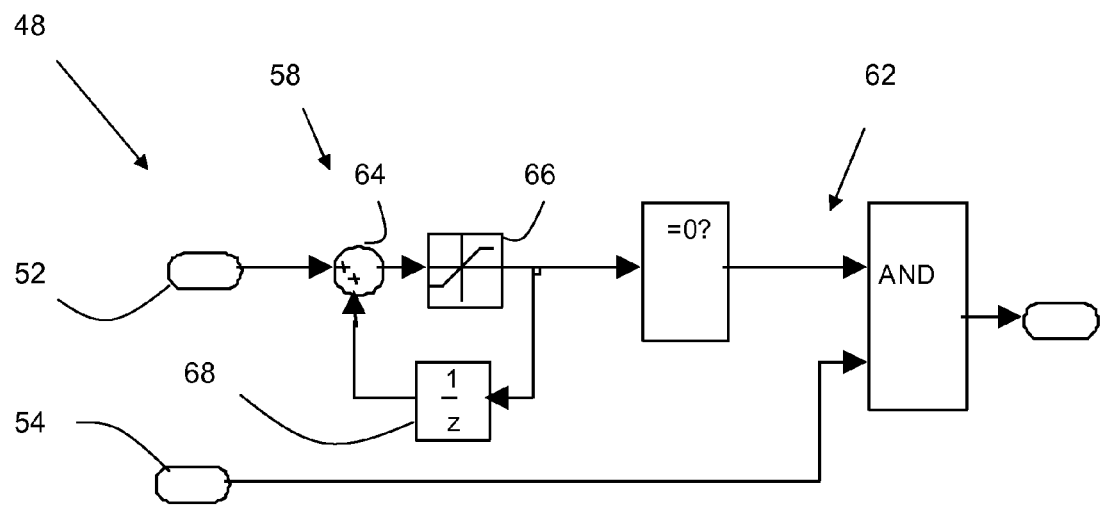

FIG. 6 shows the token inject control unit 48, which is used to switch back to the PDM stream. In this case, a single integrator 58 is used with the same features of an adder 64, a limiter 66 and a delay 68. The output of the integrator 58 is taken through logic 62 in the form of a zero detector. The output of the zero detector is combined with the command on the command input with an AND gate to provide the output.

Thus, the audio processor only switches from PDM to token outputs when the first and second integrals of the signal on the PDM stream are zero and the PDM stream 1. The audio only switches from token to PDM outputs when the first integral of the signal on the token stream is zero.

In practice one integrator gives significant reduction in the audibility of a pop or click when switching streams and two integrators are usually sufficient to provide only a hardly audible click. Although the embodiment above has a single integrator in the PDM inject control unit and two in the token inject control unit 48, either control unit may include one or two integrators.

In a further development, not shown, a third integral of the PDM stream is also taken and used to select the correct moment. In this case, all three of the first, second and third integrals of the PDM stream are zero before injecting the token. This further reduces the audibility of any pop or click.

The embodiments described above limit the output of the integrators to +1, 0 or −1 and the embdoments select for a zero in the integrals. However, in some applications the integration may be carried out with more bits. Such embodiments may select for a first integral having a modulus less than a first predetermined value and a second integral having a modulus less than a second predetermined value. The predetermined values can be selected based on the application to ensure that the period of waiting before a token is transmitted is appropriate.

Modifications of the described embodiment are possible.

For example, the embodiment described above implements the described functionality in hardware. However, software implementations of the same concept are also possible. In such a case, a general purpose computer is programmed to carry out the method as described above, namely to process a PDM stream by identifying when the first and second integrals of the PDM stream are zero before introducing a control token.

Figure 7:
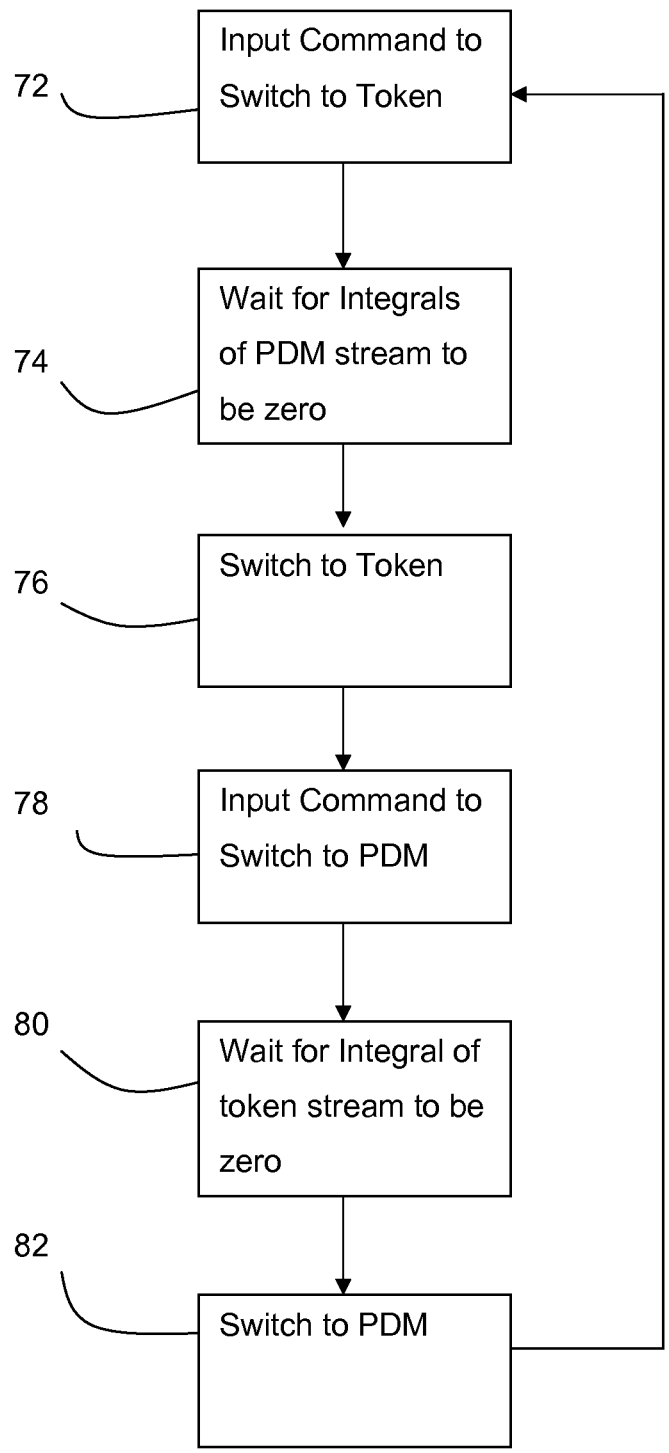
FIG. 7 is a flow diagram of the method.

In this case, a computer program product contains code to carry out the steps of a method as shown in FIG. 7. A PDM stream is output until a command is received to switch to the control stream (step 72). Then, in step 74, the program waits until the first and second integrals of the PDM stream are low, or in the specific embodiment, zero. Then, in step 76, the method switches to output the control stream.

After the control signal on the control stream is output, the method waits for a command to switch back to the PDM stream (step 78), waits for the first integral of the token stream to be zero (step 80), and then switches back (step 82).

In embodiments, the method and apparatus are used in class D audio applications. The method and apparatus may also be used in combination with mobile telephones.

The invention claimed is:

1. A method of operating a pulse density modulation (PDM) driver, comprising
    outputting a PDM stream; and
    switching to output a control stream when a first integral of the PDM stream has a magnitude less than or equal to a first predetermined value and a second integral of the PDM stream has a magnitude less than or equal to a second predetermined value.

2. A method according to claim 1, wherein at least one of the predetermined values is zero.

3. A method according to claim 1 further comprising switching back to outputting a PDM stream when the first integral of the control stream has a magnitude less than or equal to the first predetermined value.

4. A computer program product embodied on a non-transitory computer readable media, comprising computer program code arranged to carry out an operation when executed by a processor, the operation includes:
- outputting a PDM stream; and
- switching to output a control stream when a first integral of the PDM stream has a magnitude less than or equal to a first predetermined value and a second integral of the PDM stream has a magnitude less than or equal to a second predetermined value.

5. Pulse Density Modulation (PDM) apparatus, comprising:
- a switch arranged to switch between a PDM stream and a control stream; and
- command logic arranged to control the switch to switch from the pulse density modulation stream to the control stream when a first integral of the PDM stream has a magnitude less than or equal to a first predetermined value and a second integral of the PDM stream has a magnitude less than or equal to a second predetermined value.

6. A PDM apparatus according claim 5, wherein the first and second predetermined values are zero.

7. A PDM apparatus according to claim 5, further comprising:
- a circuit PDM input connected to the switch and to the command logic for accepting the PDM stream,
- a circuit token input connected to the switch and to the command logic for accepting the control stream;
- a control input connected to the command logic for controlling the command logic.

8. A PDM apparatus according to claim 7, wherein the command logic comprises:
- a PDM inject control unit having a unit stream input connected to the circuit token input and a unit command input connected to the control input arranged to output a signal to the switch to switch to the pulse density modulation stream from the command pattern when the first integral of the control stream has a magnitude less than or equal to a first predetermined value; and
- a token inject control unit having a unit stream input connected to the circuit PDM input and a unit command input connected to the control input arranged to output a signal to the switch to switch to the command pattern from the pulse density modulation stream when the first integral of the PDM stream has a magnitude less than or equal to a first predetermined value and the second integral of the PDM stream has a magnitude less than or equal to a second predetermined value.

9. A PDM apparatus according to claim 8, wherein
- the command logic further comprises an inverter;
- the unit command input of exactly one of the PDM inject control unit and the token inject control unit is connected to the control input through the inverter; and
- the unit command input of the other of the PDM inject control unit and the token inject control unit is connected directly to the control input.

10. A PDM apparatus according to claim 8 wherein each of the PDM inject control unit and the token inject control unit comprise a first integrator connected to the unit PDM input, a second integrator connected to the first integrator, and logic connected to the first integrator, the second integrator and the unit command input.

11. A PDM apparatus according to claim 10 wherein each of the first integrator and the second integrator comprises an adder, a limiter connected to the output of the adder, and a unit delay arranged to feed back the signal from the limiter to the adder with a delay.

* * * * *